United States Patent [19]

Eggenberger et al.

[11] Patent Number: 4,707,681
[45] Date of Patent: Nov. 17, 1987

[54] METHOD AND APPARATUS FOR IMPLEMENTING OPTIMUM PRML CODES

[75] Inventors: John S. Eggenberger, Sunnyvale; Arvind M. Patel, San Jose, both of Calif.

[73] Assignee: International Business Machines Corporation, Armonk, N.Y.

[21] Appl. No.: 855,641

[22] Filed: Apr. 24, 1986

[51] Int. Cl.$^4$ .............................................. H03M 7/00
[52] U.S. Cl. .............................................. 340/347 DD
[58] Field of Search ................................. 340/347 DD

[56] References Cited

U.S. PATENT DOCUMENTS 4,567,464  1/1986  Siegel et al. ................. 340/347 DD

OTHER PUBLICATIONS

Kabal et al, "Partial-Response Signaling", IEEE Trans. on Comm., vol. COM-23, No. 9, Sep. 1975.
Forney, "The Viterbi Algorithm", Proc. of the IEEE, vol. 61, No. 3, 3/73.
Forney, "Maximum-Likelihood Sequence Estimation of Digital Sequences in the Presence of Intersymbol Interference", IEEE Trans. on Info. Theory, vol. IT-18, No. 3, May 1972.
Kobayashi, "Application of Probabilistic Decoding to Digital Magnetic Recording Systems", IBM J. Res. Develop., Jan. 1971.
Nishimura et al, "A Design Method for Optimum Equalization in Magnetic Recording with Partial Response Channel Coding", IEEE Trans. on Mag., vol. MAG-19, No. 5, Sep. 1983.
Patel, "Improved Encoder and Decoder for a Byte-Oriented (0,3) 8/9 Code", IBM Tech. Discl. Bulletin, vol. 28, No. 5, Oct. 1985, pp. 1938-1940.
Patel, "Encoder & Decoder for a Byte-Oriented (0,3) 8/9 Code", IBM Tech. Discl. Bulletin, vol. 18, No. 1, Jun. 1975, pp. 248-251.

*Primary Examiner*—William M. Shoop, Jr.
*Assistant Examiner*—Richard K. Blum
*Attorney, Agent, or Firm*—F. David LaRiviere; Henry E. Otto, Jr.

[57] ABSTRACT

Rate 8/9, constrained codes having run length limitation parameters (0, 4/4) and (0, 3/6) are provided for any partial response (PR) signalling system employing maximum likelihood (ML) detection.

18 Claims, 11 Drawing Figures

CONNECTIVITY:- T's REPRESENT CONNECTION, CROSSOVERS
ARE NOT CONNECTED ie

LINES CONNECTED

LINES NOT CONNECTED

GATES:-

AND

OR

—| REPRESENTS A NEGATED INPUT

|— REPRESENTS A NEGATED OUTPUT

| 73 | 116 | 183 | 225 | 268 | 310 | 361 | 402 | 438 | 479 |
|---|---|---|---|---|---|---|---|---|---|
| 75 | 117 | 185 | 227 | 269 | 311 | 363 | 403 | 439 | 481 |
| 76 | 118 | 186 | 228 | 270 | 313 | 364 | 406 | 441 | 483 |
| 77 | 119 | 187 | 229 | 271 | 314 | 365 | 407 | 442 | 484 |
| 78 | 121 | 188 | 230 | 281 | 315 | 366 | 409 | 443 | 485 |
| 79 | 122 | 189 | 231 | 282 | 316 | 367 | 410 | 444 | 486 |
| 89 | 123 | 190 | 233 | 283 | 317 | 369 | 411 | 445 | 487 |
| 90 | 124 | 191 | 235 | 284 | 318 | 370 | 412 | 446 | 489 |
| 91 | 125 | 195 | 236 | 285 | 319 | 371 | 413 | 447 | 491 |
| 92 | 126 | 198 | 237 | 286 | 329 | 372 | 414 | 451 | 492 |
| 93 | 127 | 199 | 238 | 287 | 331 | 373 | 415 | 454 | 493 |
| 94 | 146 | 201 | 239 | 289 | 332 | 374 | 417 | 455 | 494 |
| 95 | 147 | 203 | 241 | 291 | 333 | 375 | 419 | 457 | 495 |
| 97 | 150 | 204 | 242 | 292 | 334 | 377 | 420 | 459 | 497 |
| 99 | 151 | 205 | 243 | 293 | 335 | 378 | 421 | 460 | 498 |
| 100 | 153 | 206 | 244 | 294 | 345 | 379 | 422 | 461 | 499 |
| 101 | 154 | 207 | 245 | 295 | 346 | 380 | 423 | 462 | 500 |
| 102 | 155 | 210 | 246 | 297 | 347 | 381 | 425 | 463 | 501 |
| 103 | 156 | 211 | 247 | 299 | 348 | 382 | 427 | 466 | 502 |
| 105 | 157 | 214 | 249 | 300 | 349 | 383 | 428 | 467 | 503 |
| 107 | 158 | 215 | 250 | 301 | 350 | 390 | 429 | 470 | 505 |
| 108 | 159 | 217 | 251 | 302 | 351 | 391 | 430 | 471 | 506 |
| 109 | 177 | 218 | 252 | 303 | 353 | 393 | 431 | 473 | 507 |
| 110 | 178 | 219 | 253 | 305 | 355 | 395 | 433 | 474 | 508 |
| 111 | 179 | 220 | 254 | 306 | 356 | 396 | 434 | 475 | 509 |
| 113 | 180 | 221 | 255 | 307 | 357 | 397 | 435 | 476 | 510 |
| 114 | 181 | 222 | 265 | 308 | 358 | 398 | 436 | 477 | 511 |
| 115 | 182 | 223 | 267 | 309 | 359 | 399 | 437 | 478 | |

METHOD AND APPARATUS FOR IMPLEMENTING OPTIMUM PRML CODES

BACKGROUND OF THE INVENTION

Partial Response Maximum Likelihood (PRML) techniques have been long associated with digital communication channels. See for example, Y. Kabal and S. Pasupathy, "Partial-Response Signaling", IEEE Trans. Commun. Technol., Vol. COM-23, pp. 921–934, September 1975; R. W. Lucky, J. Salz and E. J. Weldon, Jr., PRINCIPLES OF DATA COMMUNICATIONS, New York: McGraw-Hill, 1968; G. D. Forney, Jr., "The Viterbi Algorithm", Proc. IEEE, Vol. 61, pp. 268–278, March 1973; and J. M. Wozencraft and I. M. Jacobs, PRINCIPLES OF COMMUNICATION ENGINEERING, New York: Wiley, 1965. Applying the principles of PRML signaling and detection to recording channels of mass storage devices is also well known. See for example, G. D. Forney, "Maximum Likelihood Sequence Estimation of Digital Sequences in the Presence of Intersymbol Interference", IEEE Trans. Inform. Theory, Vol. IT-18, pp. 363–378, May 1982; H. Kobayashi, "Application of Probabilistic Decoding to Digital Magnetic Recording", IBM. J. RES. DEVELOP., Vol. 15, pp. 64–74, January 1971; and K. Nishimura and K. Ishii, "A Design Method for Optimal Equalization in Magnetic Recording Channels with Partial Response Channel Coding", IEEE Trans. Magn., Vol. MAG-19, pp. 1719–1721, September 1983.

Data detection in conventional prior art peak-detection magnetic recording channels is achieved by first differentiating the analog signal and then processing the differentiated signal with a zero-crossing detector to determine the presence or absence of a zero-crossing event within the detection window. Data detection in a digital communication channel is generally based on periodically sampling the amplitude of the transmitted signal.

In the absence of noise or other imperfections, the zero crossings of the derivative signal in peak detection occur only at times corresponding to the clocktimes at which a transition was written. Enhancements such as precompensation, run-length-limited (RLL) codes and more sophisticated detectors have extended the performance of peak-detection systems.

In sampled or clocked detection, the amplitude of the signal is periodically sampled and the data which those samples represent is interpreted therefrom. Maximum likelihood (ML) detection minimizes the probability of error when the samples are interpreted.

Sampled amplitude detection anticipates the presence of interfering non-zero sample amplitudes corresponding to each input at more than one sampling time. Such signals are referred to as partial response (PR) signals, and channels which transmit PR signals are often referred to as PR channels.

ML detection is typically used in PR channels (hereafter, PRML channels) although, barring cost and complexity considerations, it can be used in peak detection and other applications as well. Typically, for a given channel bandwidth, a PR signal permits transmission of data at a higher rate than full response signals which have zero amplitude at all but one of the sampling times. In addition to filtering the readback signal to condition it for most accurate detection and interpretation, other techniques, such as encoding the data, are used to enhance performance of ML detectors.

Encoding data for use with recording channels is also known. The (d,k) constraints, which specify the minimum and maximum run lengths of zeroes, respectively, in RLL codes used in peak-detection systems, reduce intersymbol interferences while maintaining self-clocking characteristics of the data signal. See, for example, IBM TECHNICAL DISCLOSURE BULLETIN, Vol. 28, No. 5, October 1985, pp. 1938–1940, entitled "Improved Encoder and Decoder for a Byte-Oriented (0,3) 8/9 Code", and IBM TECHNICAL DISCLOSURE BULLETIN, Vol. 18, No. 1, June 1975, pp. 248–251, entitled "Encoder and Decoder for a Byte-Oriented (0,3) 8/9 Code".

In a PRML channel, a channel code can also be used to provide clocking and automatic gain control (AGC) information. Since the maximum run length of nominally zero samples must be limited, the k constraint is still appropriate when specifying the channel code requirements for PRML channels. However, RLL codes with d greater than zero are not necessary in PRML channels because compensation for ISI is inherent in the ML detector. Thus, there is no need to reduce interference by coding with a d constraint.

On the other hand, the k constraint is not the only constraint required for the PRML channel. Since ML detection requires that more than one option be kept open with respect to recent past data estimators, an additional constraint is desired to limit both detector delay and hardware complexity. If a data sequence of the input signal is demultiplexed into an even indexed sample subsequence and an odd indexed sample subsequence, and ML detection is applied to each subsequence independently, a constraint on the number of successive nominally zero samples in each subsequence adequately limits the detector delay and hardware. Thus, in terms of NRZI data representation, the required limitation is on the maximum number of sequential zeroes in both the even-indexed and the odd-indexed subsequences. The maximum number of sequential NRZI zeroes in either subsequence is referred to as the $k_1$ constraint, and is analogous to the k constraint for the overall sequence of data.

Codes having run length constraints restrict the allowed code sequences to less than $2^n$ sequences possible, where n specifies the number of data symbols in a sequence. The rate of such a code is less than 1 data bit to 1 code bit, which can be expressed as a ratio of small integers. Thus, if an 8-bit data byte is mapped into a 9-bit codeword, the code rate is 8/9.

SUMMARY OF THE INVENTION

The present invention relates to modulation codes suitable for PR channels employing ML detection. These modulation codes improve performance of the timing and gain control circuits of the channel by providing frequent non-zero samples. In addition, they limit the complexity of the ML detector by forcing path merging in the path memory during processing of data estimators.

The modulation codes according to the present invention are characterized by three parameters d, k, and $k_1$ written (d, $k/k_1$). The parameters d and k represent the minimum and maximum of run lengths of zeroes in the channel output code bit sequence, where a run length of zeroes may be regarded as a period of silence in the detection process. The parameter $k_1$ represents the maximum run length of zeroes in the particular all-even or all-odd subsequences. In the codes of the present invention, d equals 0 since a minimum run length of zeroes is inapposite in the context of PRML channel. A small value of k is desirable for accurate timing and gain control, and a small value of $k_1$ reduces the size of the path memory required in the ML detector.

In particular, the present invention is related to PRML code constraints for use in magnetic recording of digital data in disk memory devices. The code constraints and the apparatus for encoding and decoding data in accordance therewith is applicable, however, to any PR signaling system employing ML detection.

According to the present invention, the smallest value of the parameters k and $k_1$ for which a rate 8/9, $(0,k/k_1)$ block code exists are (0,3/6) and (0,4/4). The present invention provides optimized sequential logic circuits including look-up tables for encoding and decoding rate 8/9 block codes having these parameters.

DESCRIPTION OF THE DRAWING

FIG. 4 is a table of 279 decimal numbers equivalent to 9-bit binary sequences derived in accordance with the principles of the present invention for the rate 8/9, (0,4/4) code.

FIG. 7 is a table of 272 decimal numbers equivalent to 9-bit binary sequences derived in accordance with the principles of the present invention for the rate 8/9, (0,3/6) code.

DESCRIPTION OF THE PREFERRED EMBODIMENT

Figure 1:
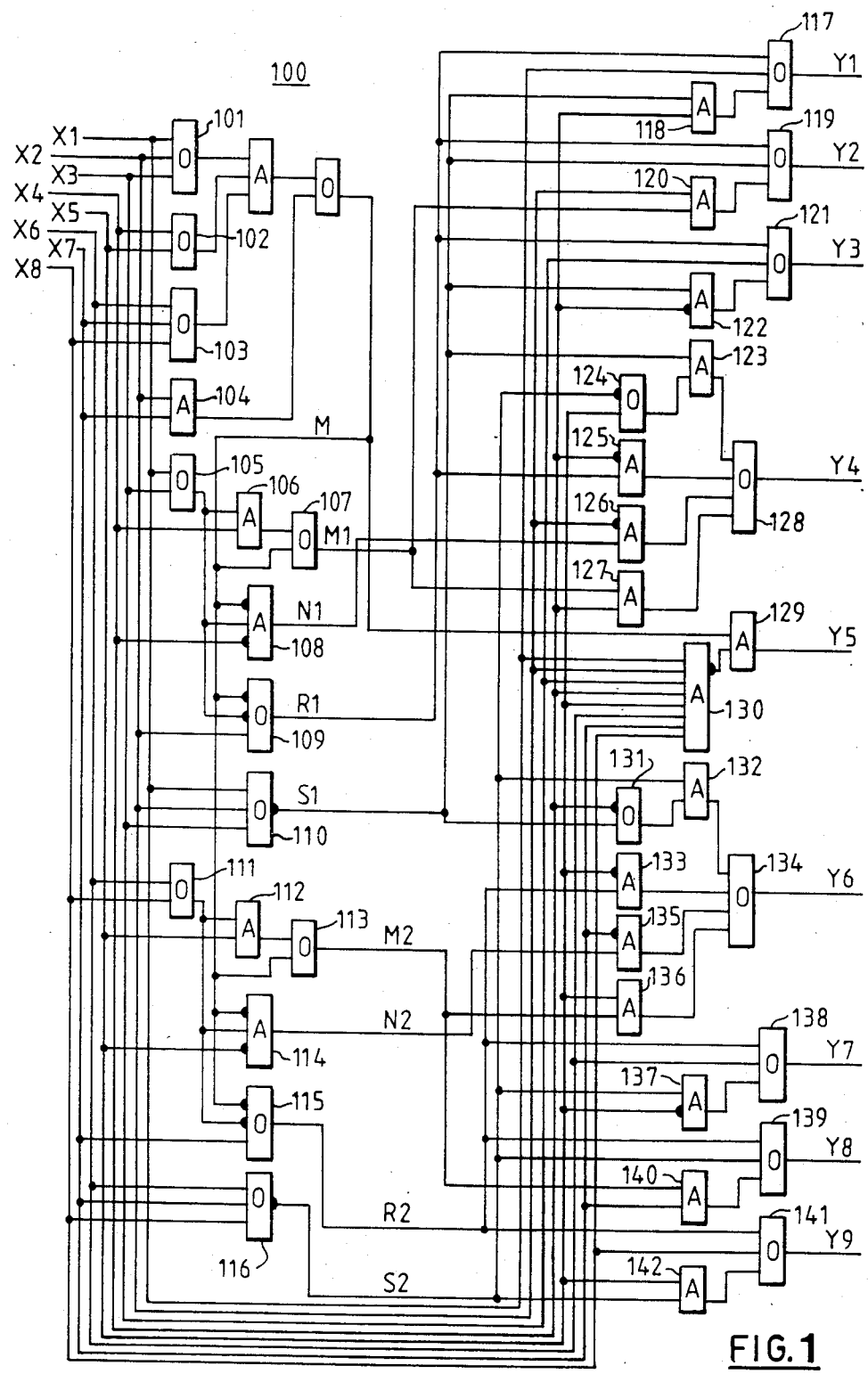
FIG. 1 is a schematic diagram of a PRML system modulation code encoder for a code having rate 8/9 and run length constraints (0,4/4), constructed according to the principles of the present invention.

In accordance with the present invention, a rate 8/9 RLL block code having (0,4/4) constraints provides 279 9-bit codewords from 8-bit data bytes. Thus, at least 256 codewords of 9 bits each can be uniquely defined where all catenations of such codewords comply with the d, $k/k_1$ constraint. The code provides for specific assignment of 8-bit data bytes to 9-bit codewords which preserves read backward symmetry and creates partitions of bytes and codewords with similar structure. The partitions of bytes are uniquely identifiable and overall mapping of the codewords is produced by gating partition bits according to simple boolean functions.

If Y denotes a 9-bit codeword in the $(0,k/k_1)$ code, then $$Y = [Y_1, Y_2, Y_3, Y_4, Y_5, Y_6, Y_7, Y_8, Y_9] \quad (1)$$

The constraint k=4 in the overall coded sequence can be produced by eliminating 9-bit sequences with run lengths of 3 zeroes at either end thereof, or run lengths of 5 zeroes within each 9-bit sequence. Such a constraint is given by the following boolean relation:

$$(Y_1 + Y_2 + Y_3)(Y_2 + Y_3 + Y_4 + Y_5 + Y_6)$$
$$(Y_3 + Y_4 + Y_5 + Y_6 + Y_7)(Y_4 + Y_5 + Y_6 + Y_7 + Y_8)$$
$$(Y_7 + Y_8 + Y_9) = 1 \quad (2)$$

Similarly, the constraint $k_1=4$ is described by the following two equations for the sequence of all odd-bit positions and the sequence of all even-bit positions, respectively, in Equations (3) and (4) given below.

$$(Y_1 + Y_3 + Y_5)(Y_5 + Y_7 + Y_9) = 1 \quad (3)$$

$$(Y_2 + Y_4 + Y_6)(Y_4 + Y_6 + Y_8) = 1 \quad (4)$$

Two hundred seventy-nine valid 9-bit binary sequences satisfy Equations (2), (3), and (4), the decimal equivalents for which are given in FIG. 4. Thus, 23 excess codewords are available for special purposes or for use as alternates to eliminate undesirable codeword patterns.

Referring now to FIG. 1, an 8-bit binary data byte, denoted X, and its assigned 9-bit codeword, Y, are given by:

$$X = [X_1, X_2, X_3, X_4, X_5, X_6, X_7, X_8] \quad (5)$$

$$Y = [Y_1, Y_2, Y_3, Y_4, Y_5, Y_6, Y_7, Y_8, Y_9] \quad (6)$$

The first partition of codeword assignments, denoted M, comprises the set of data bytes in which the first and last four bits of the 8-bit binary data bytes can be mapped without change into the first and last four bits, respectively, of the 9-bit codeword, Y. The middle bit, i.e. the fifth bit position, of the 9-bit codeword in this partition is always 1. Thus, partition M comprises 163 codewords which can be identified by the relation:

$$M = (X_1 + X_2 + X_3)(X_4 + X_5)(X_6 + X_7 + X_8) + X_2 X_7 \quad (7)$$

A second partition, $M_1$, comprises 8-bit binary data bytes in which the first four bytes of Y are the same as those in X. Thus, $M_1$, which includes M, comprises twelve additional codeword assignments identified by a specific structure of the first four bits in X given by the equation:

$$M_1 = M + (X_1 + X_3)X_4 \quad (8)$$

The remaining 81 codeword assignments are divided into partitions $N_1$, $R_1$ and $S_1$, which identify 42, 7 and 32 codeword assignments, respectively. These assignments are given by the following structures of the first four bits in X:

$$N_1 = \overline{M}(X_1 + X_3)\overline{X_4} \quad (9)$$

$$R_1 = \overline{M}(\overline{X_1 + X_3})X_2 \quad (10)$$

$$S_1 = \overline{M}(\overline{X_1 + X_3})\overline{X_2} \quad (11)$$

The code inherently provides read-backward symmetry, which means that the last four bits of X are mapped into the last four bits of Y symmetrically with respect to the first four bits of Y, read backwards. Thus, the last four bits of the last-mentioned remaining 81 codeword assignments are given by partitions $M_2$, $N_2$, $R_2$ and $S_2$ which are backwardly symmetrical counterparts of the partition sets $M_1$, $N_1$, $R_1$ and $S_1$, respectively. In particular, $M_2$, $N_2$, $R_2$ and $S_2$ are identified by exclusive structures of the last four bits of X given by logic equations symmetrical to Equations (8), (9), (10) and (11) as given in Chart I.

To avoid an all ones coded sequence, the middle bit, $Y_5$, is changed to zero which, in turn, creates another valid codeword. The logic equations for encoder 100 of FIG. 1 are given in Chart I.

The decoder function identifies the same partitions as those in the encoder, using the exclusive structures of bit patterns in the 9-bit sequence Y to obtain logic equations for the components of X. Decoder equations for the decoder of FIG. 2 are provided in Chart II.

Referring now to FIG. 1, encoded variables, $X_1$–$X_8$ are received by gates 101–106, 108–112, 114–118, 120–122, 124–127 and 130–142 of encoder 100. In response to such variables, gates 107–110 produce codeword partitions $M_1$, $N_1$, $R_1$ and $S_1$, respectively. Similarly, gates 113–116 produce codeword partitions $M_2$, $N_2$, $R_2$ and $S_2$. Finally, encoded variables $Y_1$–$Y_9$ are produced by gates 117, 119, 121, 128, 129, 134, 138, 139 and 141, respectively.

Figure 2:
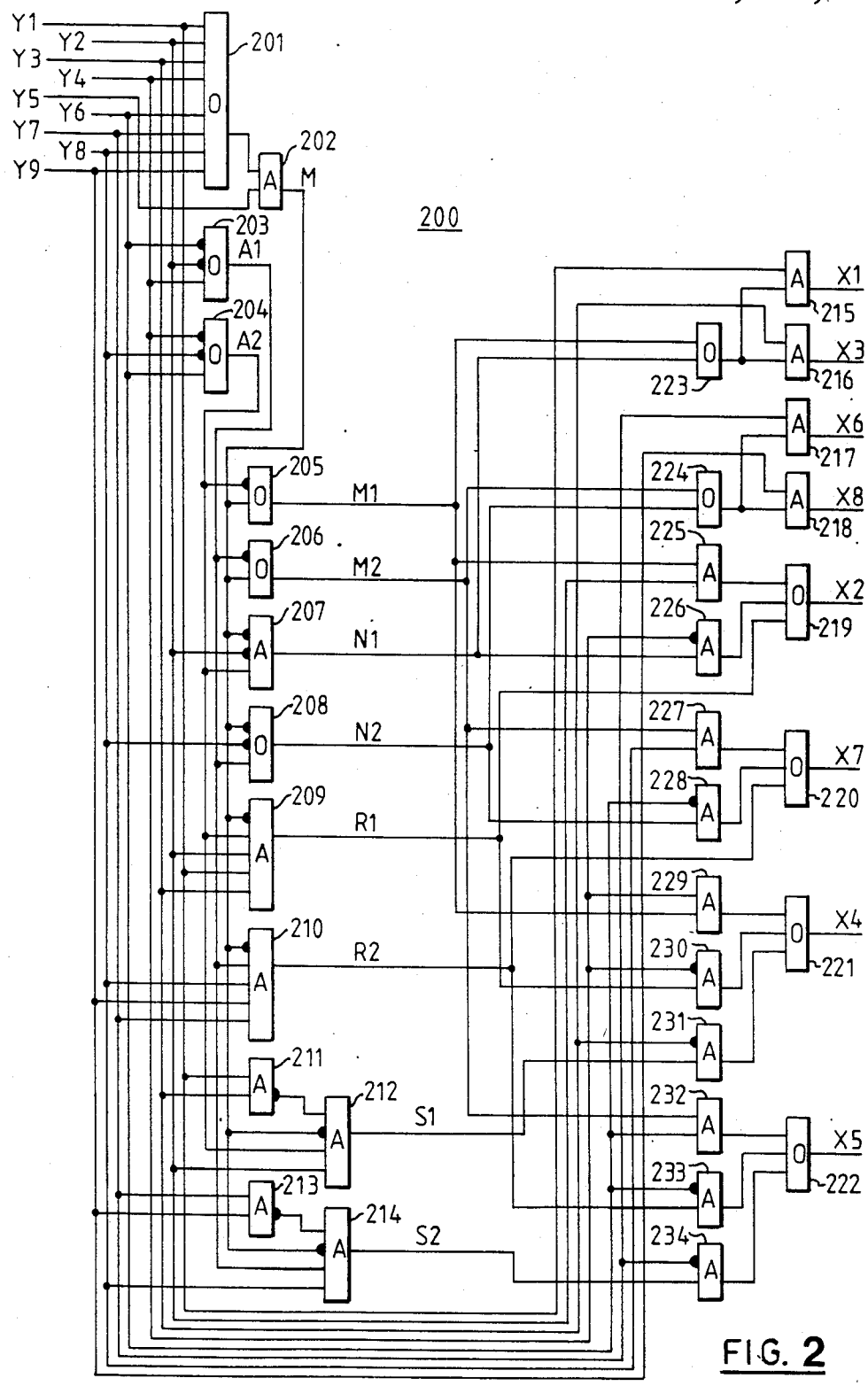
FIG. 2 is a schematic diagram of a PRML system modulation code decoder for a code having rate 8/9 and run length constraints (0,4/4), constructed according to the principles of the present invention.
Figure 3:
FIG. 3 is a legend of schematic symbol conventions used in FIGS. 1, 2, 5 and 6.
Figure 3:
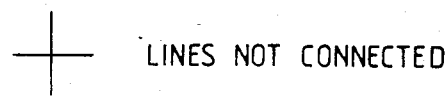
Figure 3:
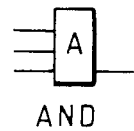
Figure 3:
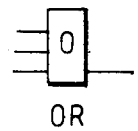

Coded variables, $Y_1$–$Y_9$, are received by gates 201–204, 207–218 and 225–234 of decoder 200 as shown in FIG. 2. Backward reading, codeword partitions, $M_1$, $N_1$, $R_1$ and $S_1$, for recreating uncoded variables, i.e. the data, are produced by gates 205, 207, 209 and 212, respectively, in response to coded variables $Y_1$–$Y_9$. Similarly, partitions $M_2$, $N_2$, $R_2$ and $S_2$ are produced by gates 206, 208, 210 and 214, respectively. Finally, the data, $X_1$–$X_8$, is provided by gates 215, 219, 216, 221, 222, 217, 220 and 218, respectively.

Another version of rate 8/9 (0, k/$k_1$) codes in accordance with the present invention have k=3 and $k_1$=6. The partition of codeword assignments for a (0,3/6) block code is given in Chart III which shows logic equations for partitions $M_1$, $M_2$, $M_3$, M, E, $N_1$, $R_1$, $S_1$, $N_2$, $R_2$, and $S_2$. Also shown in Chart III are the encoder logic functions for encoder 500 of FIG. 5.

The decoder function identifies the partitions M, E, $N_1$, $R_1$, $S_1$, $N_2$, $R_2$, and $S_2$ using the structure of the 9-bit codeword Y. The logic equations for these partitions, as well as the decoder logic functions for decoder 600 of FIG. 6 are given in Chart IV.

Figure 5A:
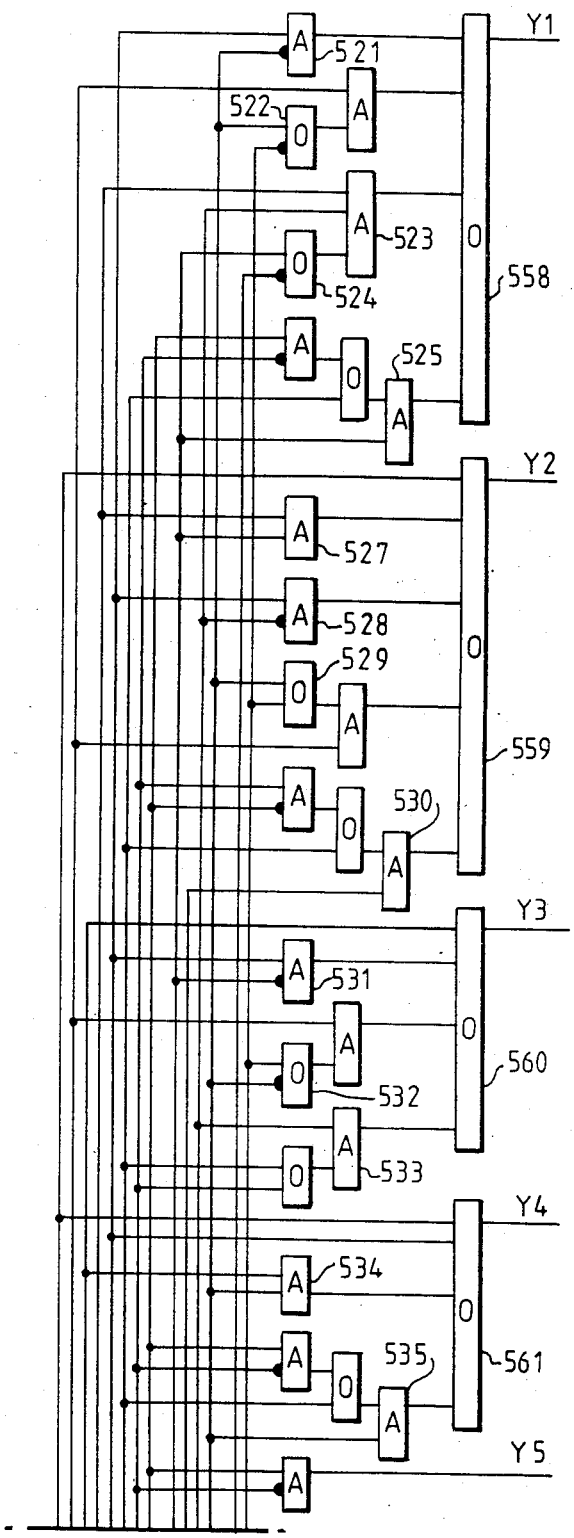
FIG. 5 is a schematic diagram of a PRML system modulation code decoder for a code having rate 8/9 and run length constraints (0,3/6), constructed according to the principles of the present invention.
Figure 5B:
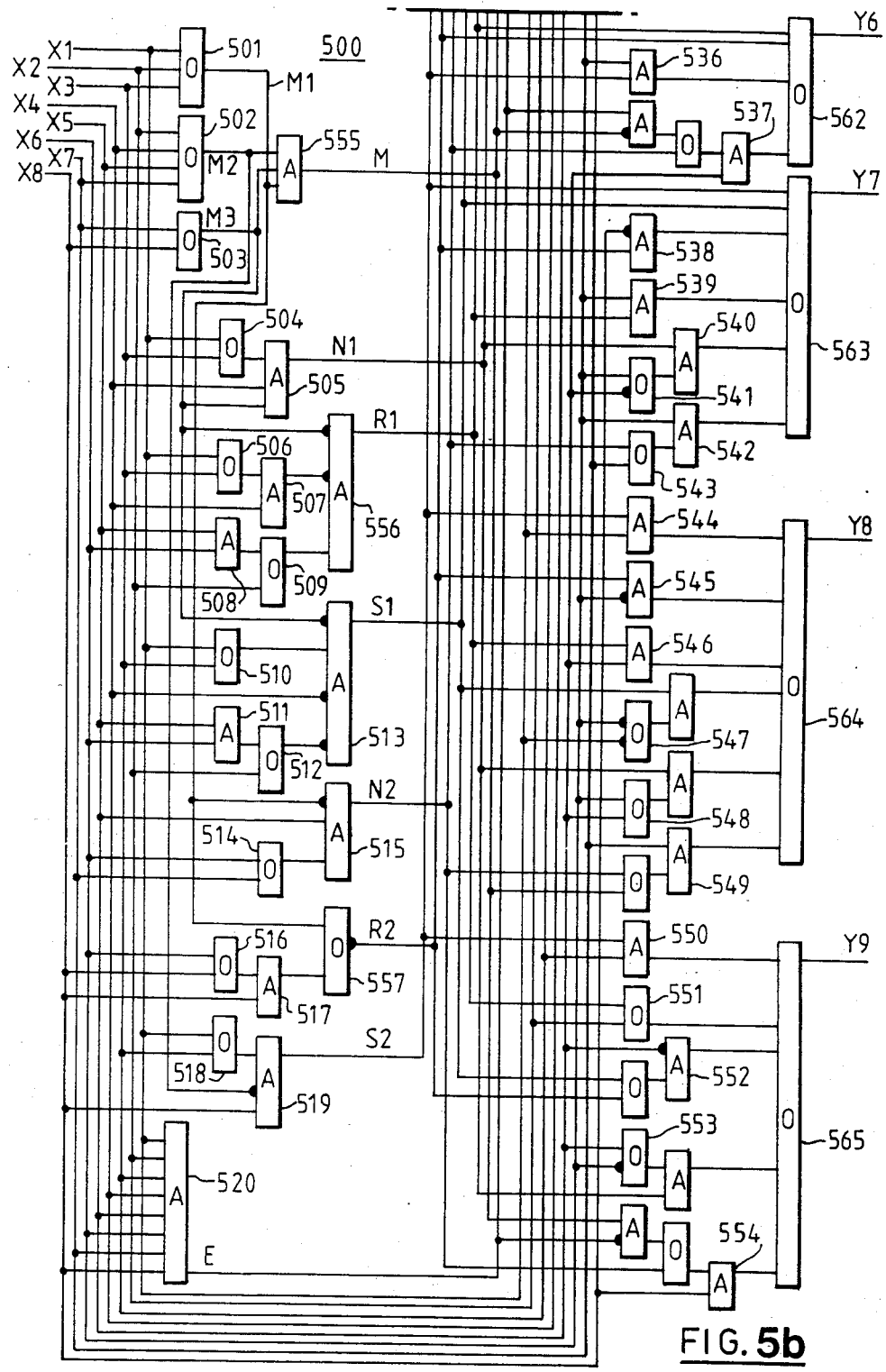

Referring now to FIG. 5, encoded variables $X_1$–$X_8$ are received by gates 501–554 of encoder 500. In response to such variables, gates 501–503, 555, 520, 505, 556, 513 produce codeword partitions $M_1$, $M_2$, $M_3$, M, E, $N_1$, $R_1$, and $S_1$, respectively. Similarly, gates 515, 557, 519 produce codeword partitions $N_2$, $R_2$, and $S_2$. Finally, encoded variables $Y_1$–$Y_9$ are produced by gates 558–565, respectively.

Figure 6A:
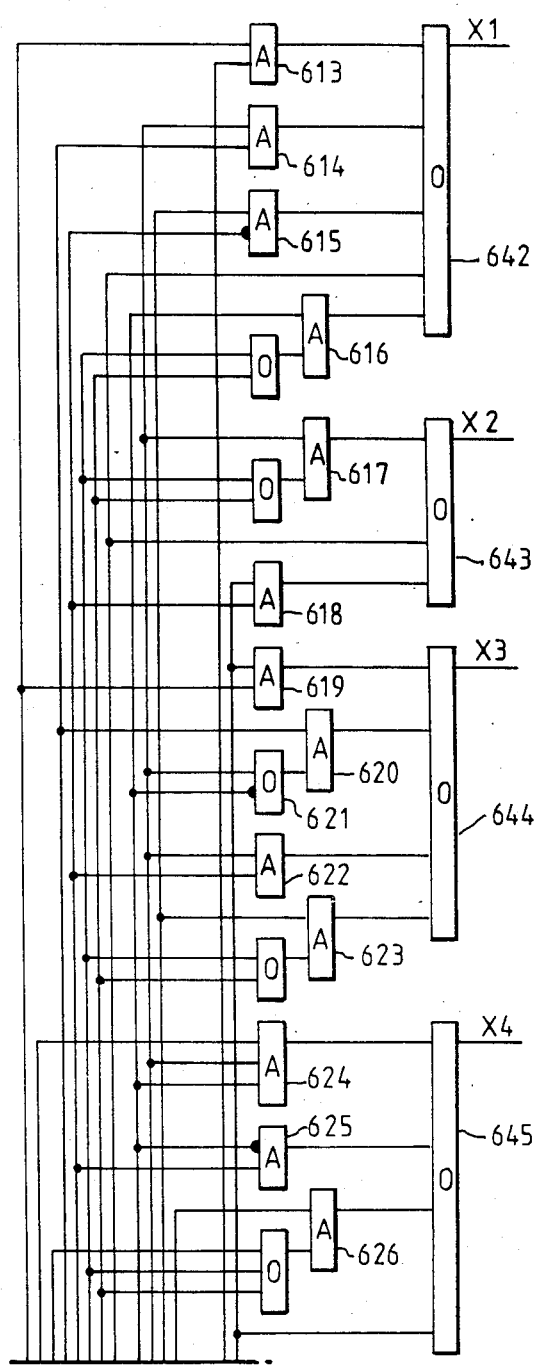
FIG. 6 is a schematic diagram of a PRML system modulation code decoder for an alternative code having rate 8/9 and run length constraints (0,3/6), constructed according to the principles of the present invention.
Figure 6B:
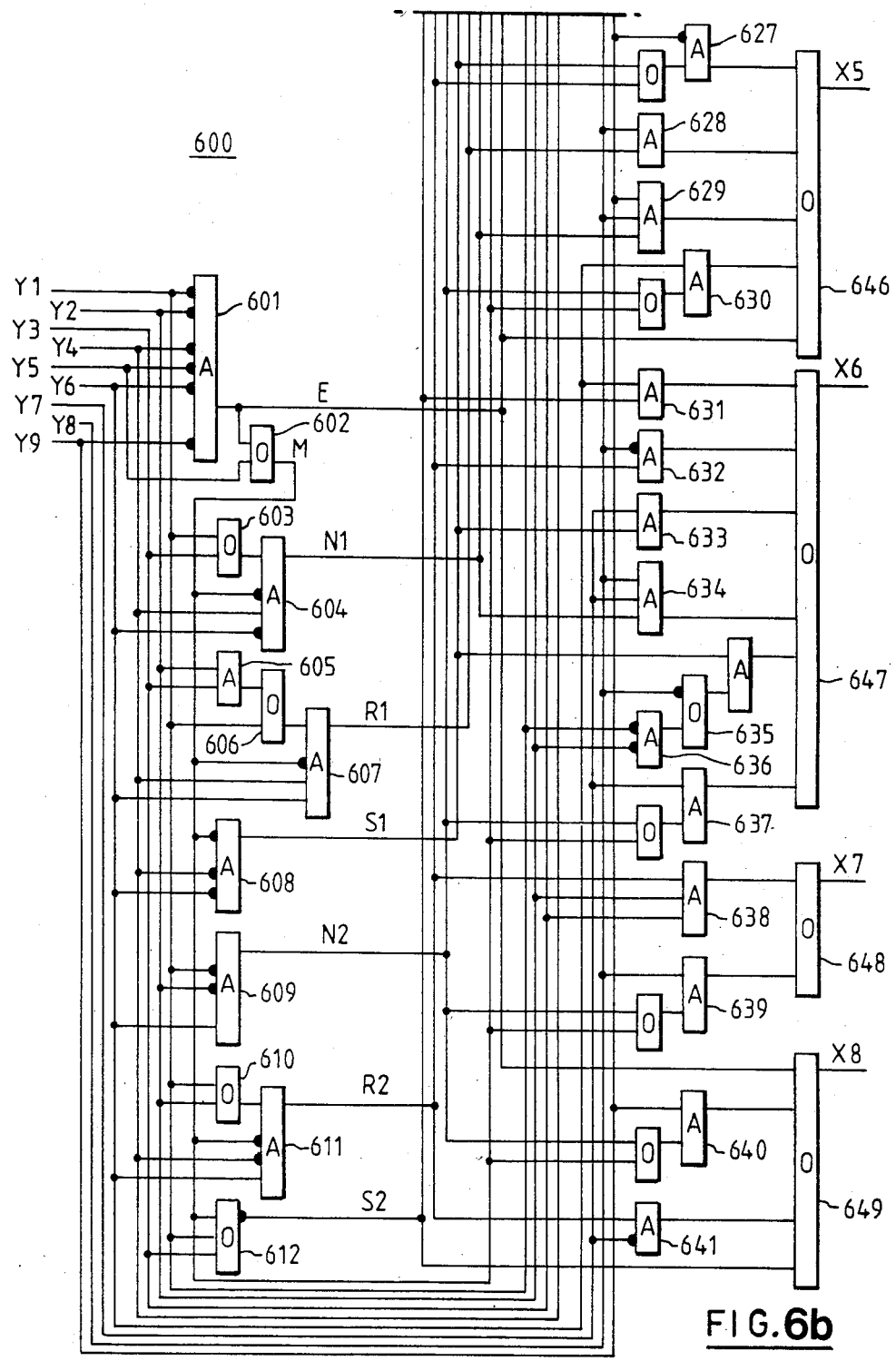

Finally, coded variables $Y_1$–$Y_9$ are received by gates 601–641 of decoder 600 as shown in FIG. 6. Decoding partitions E, $N_1$, $R_1$ and $S_1$ are produced by gates 601, 604, 607 and 608, respectively, in response to coded variable $Y_1$–$Y_9$. Similarly, partitions $M_1$, $N_2$, $R_2$ and $S_2$ are produced by gates 602, 609, 611 and 612, respectively. Decoded data $X_1$–$X_8$ is provided by gates 642–649, respectively.

The constraints k=3 and $k_1$=6 of the (0,3/6) code are obtained from the following boolean relations:

$$(Y_1+Y_2+Y_3)(Y_2+Y_3+Y_4+Y_5)$$
$$(Y_3+Y_4+Y_5+Y_6)(Y_4+Y_5+Y_6+Y_7)$$

$$(Y_5+Y_6+Y_7+Y_8)(Y_8+Y_9)=1 \qquad (12)$$

$$(Y_1+Y_3+Y_5+Y_7)(Y_3+Y_5+Y_7+Y_9)=1 \qquad (13)$$

$$(Y_2+Y_4+Y_6+Y_8)=1 \qquad (14)$$

Figure 7:
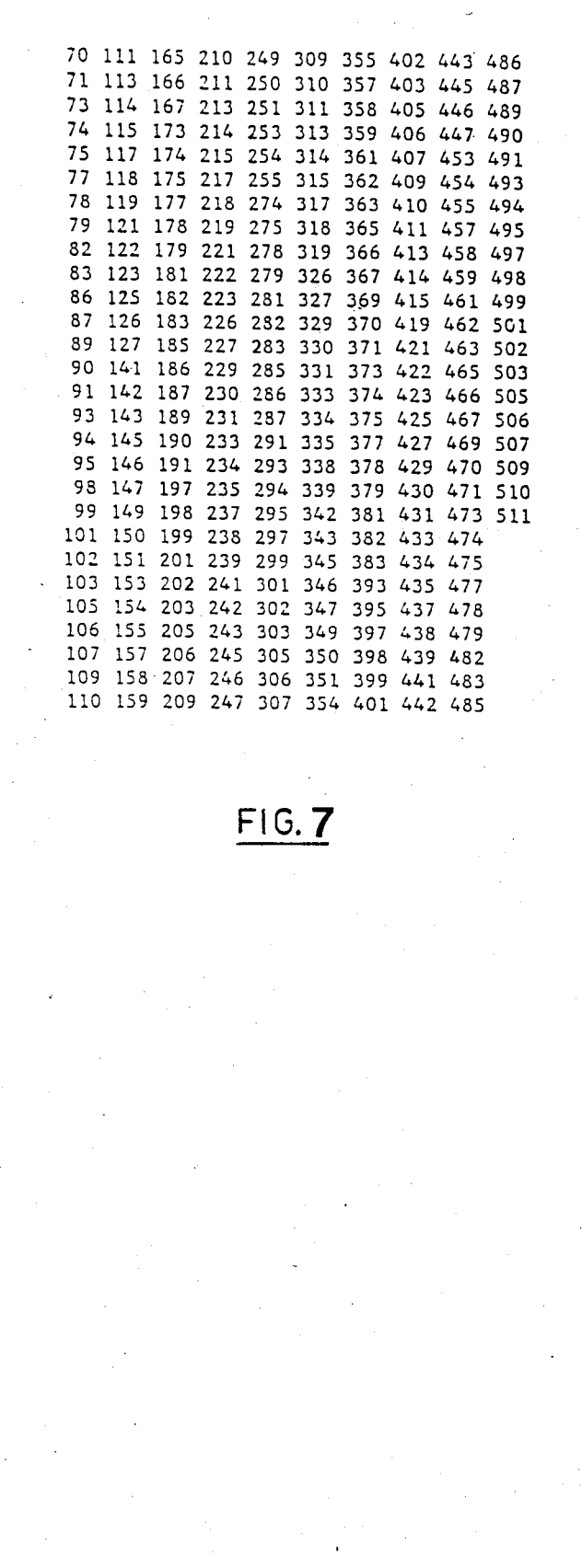

The decimal equivalents of the 272 valid 9-bit binary sequences which satisfy the equations (12), (13), and (14) are shown in FIG. 7. While the numbers in FIG. 4 are symmetric (i.e., for each 9-bit codeword represented, the number formed by reversing to order of those bits is also represented), the numbers in FIG. 7 are not so symmetric.

Both codes described in this specification are optimum block codes in that k cannot be decreased without increasing $k_1$, decreasing the rate or increasing the block length. Similarly, $k_1$ cannot be decreased without increasing k, decreasing the rate or increasing the block length.

CHART I
0,4/4 ENCODER $M = (X1 + X2 + X3) \cdot (X4 + X5) \cdot (X6 + X7 + X8) + X2 \cdot X7$ $M1 = M + (X1 + X3) \cdot X4 \qquad M2 = M + (X8 + X6) \cdot X5$ $N1 = \overline{M} \cdot (X1 + X3) \cdot \overline{X4} \qquad N2 = \overline{M} \cdot (X8 + X6) \cdot \overline{X5}$ $R1 = \overline{M} \cdot \overline{(X1 + X3)} \cdot X2 \qquad R2 = \overline{M} \cdot \overline{(X8 + X6)} \cdot X7$ $S1 = \overline{(X1 + X2 + X3)} \qquad S1 = \overline{(X8 + X7 + X6)}$ $Y1 = X1 + R1 + S1 \cdot X4$
$Y2 = M1 \cdot X2 + R1 + S1$ $Y3 = X3 + R1 + S1 \cdot \overline{X4}$ $Y4 = M1 \cdot X4 + N1 \cdot \overline{X2} + R1 \cdot \overline{X4} + S1 \cdot (\overline{X5} + S2)$ $Y5 = M \cdot \overline{(X1 \cdot X2 \cdot X3 \cdot X4 \cdot X5 \cdot X6 \cdot X7 \cdot X8)}$ $Y6 = M2 \cdot X5 + N2 \cdot \overline{X7} + R2 \cdot \overline{X5} + S2 \cdot (\overline{X4} + S1)$ $Y7 = X6 + R2 + S2 \cdot \overline{X5}$ $Y8 = M2 \cdot X7 + R2 + S2$
$Y9 = X8 + R2 + S2 \cdot X5$

CHART II
0,4/4 DECODER $M = Y5 + Y1 \cdot Y2 \cdot Y3 \cdot Y4 \cdot Y6 \cdot Y7 \cdot Y8 \cdot Y9$ $A1 = \overline{Y6} + Y2 + Y4 \qquad A2 = \overline{Y4} + \overline{Y8} + Y6$ $M1 = M + \overline{A2} \qquad M2 = M + \overline{A1}$ $N1 = \overline{M} \cdot A2 \cdot \overline{Y2} \qquad N2 = \overline{M} \cdot A1 \cdot \overline{Y8}$ $R1 = \overline{M} \cdot A2 \cdot Y2 \cdot \overline{Y1 \cdot Y3} \qquad R2 = \overline{M} \cdot A1 \cdot Y8 \cdot Y9 \cdot Y7$ $S1 = \overline{M} \cdot A2 \cdot Y2 \cdot \overline{(Y1 \cdot Y3)} \qquad S2 = \overline{M} \cdot A1 \cdot Y8 \cdot \overline{(Y9 \cdot Y7)}$ $X1 = (M1 + N1) \cdot Y1$ $X2 = M1 \cdot Y2 + N1 \cdot \overline{Y4} + R1$ $X3 = (M1 + N1) \cdot Y3$ -continued
CHART II
0,4/4 DECODER $X4 = M1 \cdot Y4 + R1 \cdot \overline{Y4} + S1 \cdot \overline{Y3}$ $X5 = M1 \cdot Y6 + R2 \cdot \overline{Y6} + S2 \cdot \overline{Y7}$ -continued
CHART II
0,4/4 DECODER $X6 = (M2 + N2) \cdot Y7$ $X7 = M2 \cdot Y8 + N2 \cdot \overline{Y6} + R2$ $X8 = (M2 + N2) \cdot Y9$

CHART III
0,3,6 ENCODER $M1 = X1 + X2 + X3 \quad M2 = X7 + X8 \quad M3 = X2 + X4 + X5 + X7$
$M = M1 \cdot M1 \cdot M3$ $E = X1 \cdot X2 \cdot X3 \cdot X4 \cdot X5 \cdot X6 \cdot X7 \cdot X8$ $N1 = \overline{M2} \cdot (X1 + X3) \cdot X4$ $N2 = \overline{M1} \cdot (X8 + X6) \cdot X5$ $R1 = \overline{M2} \cdot (X2 + X5 \cdot X6) \cdot \overline{(X1 + X3) \cdot X4}$ $R2 = \overline{M1} \cdot \overline{(X8 + X6) \cdot X5}$ $S1 = \overline{M2} \cdot \overline{(X2 + X5 \cdot X6)} \cdot (X1 + X3) \cdot \overline{X4}$ $S2 = \overline{M3} \cdot (X1 + X3) \cdot X8$ $Y1 = (\overline{E} \cdot M + N1) \cdot X1 + R1 \cdot \overline{X4} + R2 \cdot (X4 + \overline{X7}) + S1 \cdot X3 \cdot (X1 + \overline{X6})$ $Y2 = (\overline{E} \cdot M + N1) \cdot X2 + R1 \cdot \overline{X3} + R2 \cdot (X4 + X7) + S1 \cdot X1 + S2$ $Y3 = (M + N1) \cdot X3 + N2 + R1 \cdot \overline{X1} + R2 \cdot (\overline{X4} + X7) + S1$ $Y4 = (\overline{E} \cdot M + N1) \cdot X4 + N2 \cdot X4 + R1 + S2$ $Y5 = \overline{E} \cdot M$ $Y6 = (\overline{E} \cdot M + N2) \cdot X5 + R1 + R2 + S2 \cdot X6$ $Y7 = (M + N2) \cdot X6 + N1 \cdot (\overline{X5} + X6) + R1 \cdot X6 + R2 \cdot \overline{X8} + S1 + S2$ $Y8 + (M + N2) \cdot X7 + N1 \cdot (X5 + X6) + R1 \cdot X5 + R2 \cdot \overline{X6} + S1 \cdot (\overline{X1} + \overline{X6}) + S2 \cdot X1$ $Y9 = (\overline{E} \cdot M + N2) \cdot X8 + N1 \cdot (X5 + \overline{X6}) + R1 \cdot X2 + \overline{X5} \cdot (R2 + S1) + S2 \cdot X3$

CHART IV
0,3/6 DECODER $E = \overline{Y1} \cdot \overline{Y2} \cdot \overline{Y4} \cdot \overline{Y5} \cdot \overline{Y6} \cdot \overline{Y9}$ $M = Y5 + E$ $N1 = \overline{M} \cdot (Y1 + Y3) \cdot Y4 \cdot \overline{Y6}$ $N2 = \overline{Y1} \cdot \overline{Y2} \cdot Y6$ $R1 = \overline{M} \cdot (Y1 + Y2 + Y3) \cdot \overline{Y4} \cdot Y6$ $R2 = \overline{M} \cdot (Y1 + Y2) \cdot \overline{Y4} \cdot Y6$ $S1 = \overline{M} \cdot \overline{Y4} \cdot \overline{Y6}$ $S2 = \overline{(M + Y1 + Y3)}$ $X1 = E + (M + N1) \cdot Y1 + R1 \cdot \overline{Y3} + S1 \cdot Y2 + S2 \cdot Y8$ $X2 = E + (M + N1) \cdot Y2 + R1 \cdot Y9$ $X3 = (M + N1) \cdot Y3 + R1 \cdot \overline{Y2} + S1 \cdot (Y1 + \overline{Y2}) + S2 \cdot Y9$ $X4 = E + (M + N1 + N2) \cdot Y4 + R1 \cdot \overline{Y1} + R2 \cdot Y1 \cdot Y2$ $X5 = E + (M + N2) \cdot Y6 + N1 \cdot Y8 \cdot Y9 + R1 \cdot Y8 + \overline{Y9} \cdot (R2 + S1)$ $X6 = (M + N2) \cdot Y7 + N1 \cdot Y7 \cdot Y8 + R1 \cdot Y7 + R2 \cdot \overline{Y8} + S1 \cdot (\overline{Y1} \cdot Y2 + \overline{Y8}) + S2 \cdot Y6$ $X7 = (M + N2) \cdot Y8 + R2 \cdot Y2 \cdot Y3$

CHART IV
0,3/6 DECODER $$X8 = E + (M + N2) \cdot Y9 + R2 \cdot \overline{Y7} + S2$$

We claim:

1. Apparatus for encoding a preselectable number of bits of binary data into codewords having a preselectable number of bits, said apparatus comprising:
    receiver means for receiving the binary data; and
    encoder means, coupled to the receiver means, for producing sequences of fixed length codewords;
    said sequences having no more than a first preselected number of consecutive zeroes therein; and
    said sequences comprising two subsequences, one consisting only of odd bit positions and another consisting only of even bit positions, each of said subsequences having no more than a second preselected number of consecutive zeroes therein.

2. Apparatus as in claim 1 wherein the first and second preselected number of consecutive zeroes are equal.

3. Apparatus as in claim 2 wherein the first and second preselected number of consecutive zeroes are 4.

4. Apparatus as in claim 1 wherein the first and second preselected number of consecutive zeroes are unequal.

5. Apparatus as in claim 4 wherein the first preselected number of consecutive zeroes is three and the second preselected number of consecutive zeroes is six.

6. Apparatus as in claim 1 wherein the ratio of the number of bits in the encoded binary data to the number of bits in the codewords is 8/9.

7. Apparatus as in claim 1 wherein:
    the codewords comprise a plurality of partitions; and
    the encoder means includes a plurality of gating means for producing the partitions of codewords and output gating means for combining the partitions of codewords into the sequence of codewords.

8. Apparatus as in claim 1 further including decoding means for decoding a preselectable number of codewords into a preselectable number of bits of binary data, said decoding means comprising:
    receiver means for receiving the codewords; and
    sequential means, coupled to the receiver means, for producing sequences of binary data in response to said codewords.

9. Apparatus as in claim 8 wherein the sequential means includes a plurality of gating means for producing the partitions of binary data and output gating means for combining the partitions of binary data into the sequences of binary data.

10. A method for encoding a preselectable number of bits of binary data into codewords having a preselectable number of bits, said method comprising the steps of:
    receiving the binary data; and
    producing sequences of fixed length codewords;
    said sequences having no more than a first preselected number of consecutive zeroes therein; and
    said sequences comprising two subsequences, one consisting only of odd bit positions and another consisting only of even bit positions, each of said subsequences having no more than a second preselected number of consecutive zeroes therein.

11. The method as in claim 10 wherein the first and second preselected number of consecutive zeroes are equal.

12. The method as in claim 11 wherein the first and second preselected number of consecutive zeroes are 4.

13. The method as in claim 10 wherein the first and second preselected number of consecutive zeroes are unequal.

14. The method as in claim 13 wherein the first preselected number of consecutive zeroes is three and the second preselected number of consecutive zeroes is six.

15. The method as in claim 10 wherein the ratio of the number of bits in the encoded binary data to the number of bits in the codewords is 8/9.

16. The method as in claim 10 for decoding a preselectable number of codewords into a preselectable number of bits of binary data further comprising the steps of:
    receiving the codewords; and
    producing sequences of binary data from said codewords.

17. Apparatus as in claim 1 wherein the first or second preselected number of consecutive zeroes cannot be decreased without increasing the second or first, respectively, preselected number of consecutive zeroes.

18. Apparatus as in claim 6 wherein the first or second preselected number of consecutive zeroes cannot be decreased with decreasing said ratio.

* * * * *